(12) United States Patent
Jeong et al.

(10) Patent No.: US 8,283,245 B2
(45) Date of Patent: Oct. 9, 2012

(54) METHOD FOR FABRICATING SOLAR CELL USING INDUCTIVELY COUPLED PLASMA CHEMICAL VAPOR DEPOSITION

(75) Inventors: Chaehwan Jeong, Gwangju (KR); Jong Ho Lee, Gwangju (KR); Ho-Sung Kim, Gwangju (KR); Seongjae Boo, Gwangju (KR)

(73) Assignee: Korea Institute of Industrial Technology, Cheonan-Si, Chungcheongnam-Do ( * ) Notice: Subject to any disclaimer, the term of this patent is extended or adjusted under 35 U.S.C. 154(b) by 0 days.

(21) Appl. No.: 13/312,020

(22) Filed: Dec. 6, 2011

(65) Prior Publication Data
US 2012/0077306 A1   Mar. 29, 2012

Related U.S. Application Data

(62) Division of application No. 12/605,162, filed on Oct. 23, 2009.

(30) Foreign Application Priority Data

Feb. 17, 2009   (KR) .................. 10-2009-0013059
Feb. 18, 2009   (KR) .................. 10-2009-0013195
Feb. 18, 2009   (KR) .................. 10-2009-0013204
Oct. 23, 2009   (KR) .................. 10-2009-0101304

(51) Int. Cl.
H01L 21/44   (2006.01)
(52) U.S. Cl. .................. 438/609; 438/688; 257/E21.17
(58) Field of Classification Search .................. 438/74, 438/608, 609; 257/E21.061, E21.161
See application file for complete search history.

(56) References Cited

U.S. PATENT DOCUMENTS

| 5,677,236 | A |  | 10/1997 | Saitoh |  |
|---|---|---|---|---|---|
| 5,738,731 | A |  | 4/1998 | Shindo |  |
| 2008/0188062 | A1 | * | 8/2008 | Chen et al. | 438/483 |
| 2008/0245414 | A1 | * | 10/2008 | Sheng et al. | 136/261 |
| 2009/0293936 | A1 |  | 12/2009 | Myong |  |

FOREIGN PATENT DOCUMENTS

| JP | 11-074550 | 3/1999 |
|---|---|---|
| JP | 2001189478 | 7/2001 |
| JP | 2001291882 | 10/2001 |
| JP | 2002008982 | 1/2002 |
| JP | 2002-261312 | 9/2002 |
| JP | 2007262541 | 10/2007 |
| JP | 2009503848 | 1/2009 |
| WO | 2006/006368 | 1/2006 |

OTHER PUBLICATIONS

U.S. Appl. No. 12/605,162, May 10, 2011, Restriction Requirement.
U.S. Appl. No. 12/605,162, Sep. 16, 2011, Office Action.
U.S. Appl. No. 12/605,162, Mar. 27, 2012, Office Action.
U.S. Appl. No. 13/311,891, Mar. 14, 2012, Office Action.

* cited by examiner

Primary Examiner — Cheung Lee
(74) Attorney, Agent, or Firm — Workman Nydegger

(57) ABSTRACT

In one example, a method for fabricating a solar cell comprising a first electrode, a first-type layer, an intrinsic layer, a second-type layer and a second electrode is disclosed. At least one of the second-type layer, the intrinsic layer and the first-type layer is formed as a crystallized Si layer by an inductively coupled plasma chemical vapor deposition (ICP-CVD) device using mixed gas including hydrogen ($H_2$) gas and silane ($SiH_4$) gas, the mixed gas having a silane gas ($SiH_4$) in a ratio of 0.016 to 0.02.

13 Claims, 17 Drawing Sheets

METHOD FOR FABRICATING SOLAR CELL USING INDUCTIVELY COUPLED PLASMA CHEMICAL VAPOR DEPOSITION

CROSS-REFERENCE TO RELATED APPLICATION

This application is a divisional application of, and claims priority to, U.S. patent application Ser. No. 12/605,162 for Method for Fabricating Solar Cell Using Inductively Coupled Plasma Chemical Vapor Deposition filed Oct. 23, 2009 which claims priority to and the benefit of Korean Patent Application Nos. 10-2009-0013059, filed on Feb. 17, 2009, No. 10-2009-0013195, filed on Feb. 18, 2009, No. 10-2009-0013204, filed on Feb. 18, 2009, and No. 10-2009-0101304, filed on Oct. 23, 2009. All of the aforementioned applications are incorporated herein in their entireties by this reference.

BACKGROUND OF THE INVENTION

1. Field of the Invention

The present invention relates to a method for fabricating a solar cell using inductively coupled plasma chemical vapor deposition.

2. Related Art

As obligations to reduce greenhouse gas emission are currently accelerating under the Climate Change Convention, carbon dioxide market is booming. Accordingly, new renewable energy fields are drawing greater attention. A solar cell, a representative example of the new recyclable energy fields, directly converts sunlight, which is a limitless source of clean energy, into electricity using the photoelectric effect.

Nearly 90% of the current solar cell market is dominated by silicon (Si) wafer based solar cells and the solar cell market is considerably influenced by the supply of Si material used in producing Si wafers. Thus, due to the complexity of a high-temperature process as well as the supply shortage of Si material, technology of fabricating miniaturized, thin film solar cells by a low-temperature process is unlikely achievable.

SUMMARY OF THE INVENTION

In view of the above problems, it is an object of the present invention to provide a method for fabricating a solar cell using inductively coupled plasma chemical vapor deposition (ICP-CVD).

It is another object of the present invention to provide a method for forming a P layer of a solar cell.

It is still another object of the present invention to provide a method for forming a hydrogenised intrinsic layer of a solar cell.

It is a further object of the present invention to provide a method for forming a microcrystallized intrinsic layer of a solar cell.

In one embodiment of the present invention, there is provided a method for fabricating a solar cell comprising a first electrode, a P layer, an intrinsic layer, an N-type layer and a second electrode, the method including forming an intrinsic layer including a hydrogenated amorphous silicon (Si) thin film by an inductively coupled plasma chemical vapor deposition (ICP-CVD) device using mixed gas including hydrogen ($H_2$) gas and silane ($SiH_4$) gas, wherein silane gas is in a ratio of 8 to 10 relative to the mixed gas.

In another embodiment of the present invention, in the forming of the intrinsic layer, a working pressure may range from about 70 to about 90 mtorr, an inductively coupled plasma (ICP) power may range from about 200 to about 300 W, and a substrate temperature may range from about 250 to about 350° C.

In another embodiment of the present invention, before the forming of the intrinsic layer, the method may further include preparing a first-type Si substrate, forming a first electrode on a rear surface of the first-type Si substrate, and after the forming of the intrinsic layer, the method may further include forming a second-type layer on the intrinsic layer, and forming a second electrode on the second-type layer.

In another embodiment of the present invention, the first electrode may include Ag, the second-type layer may include a hydrogenated second-type amorphous Si layer, and the second electrode may include a transparent electrode layer formed on the second-type layer, and a patterned aluminum (Al) electrode formed on the transparent electrode layer.

In still another embodiment of the present invention, before the forming of the intrinsic layer, the method may further include preparing a transparent substrate, forming a first electrode on the transparent substrate, and forming a second-type layer on the first electrode, and after the forming of the intrinsic layer, the method may further include forming a first-type layer on the intrinsic layer, and forming a second electrode on the first-type layer.

In another embodiment of the present invention, between the forming of the second-type layer and the forming of the intrinsic layer, the method may further include forming a buffer layer, and between the forming of the first-type layer and the forming of the second electrode, the method may further include forming a transparent electrode layer on the first-type layer.

In another embodiment of the present invention, the first electrode may include a transparent conductive oxide (TCO) layer and the second electrode includes aluminum (Al).

In another embodiment of the present invention, there is provided a method for fabricating a solar cell comprising a first electrode, a first-type layer, an intrinsic layer, a second-type layer and a second electrode, the method including forming a second-type layer including an amorphous silicon (Si) carbide thin film by an inductively coupled plasma chemical vapor deposition (ICP-CVD) device using mixed gas including hydrogen ($H_2$) gas, silane ($SiH_4$) gas, diborane ($B_2H_6$) and ethylene ($C_2H_4$) gas, wherein the ethylene ($C_2H_4$) gas includes 60% hydrogen gas diluted ethylene gas, the diborane gas is 97% hydrogen gas diluted diborane gas, the mixed gas includes 1 to 1.2% ethylene gas and 6 to 6.5% diborane gas.

In one embodiment of the present invention, before the forming of the second-type layer, the method may further include preparing a first-type Si substrate, forming a first electrode on a rear surface of the first-type Si substrate, and forming an intrinsic layer on a front surface of the first-type Si substrate, and after the forming of the second-type layer, may further include forming a second electrode on the second-type layer.

In another embodiment of the present invention, the first electrode may include Ag, the intrinsic layer may include a hydrogenated second-type amorphous Si layer, and the second electrode may include a transparent electrode layer formed on the second-type layer, and a patterned aluminum (Al) electrode formed on the transparent electrode layer.

In another embodiment of the present invention, before the forming of the second-type layer, the method may further include preparing a transparent substrate, forming a first electrode on the transparent substrate, and after the forming of the second-type layer, the method may further include forming an intrinsic layer on the second-type layer, forming a first-type layer on the intrinsic layer, and forming a second electrode on the first-type layer.

In another embodiment of the present invention, between the forming of the second-type layer and the forming of the intrinsic layer, the method may further include forming a buffer layer, and between the forming of the first-type layer and the forming of the second electrode, the method may further include forming a transparent electrode layer on the first-type layer.

In another embodiment of the present invention, the first electrode may include a transparent conductive oxide (TCO) layer and the second electrode may include aluminum (Al).

In still another embodiment of the present invention, there is provided a method for fabricating a solar cell comprising a first electrode, a first-type layer, an intrinsic layer, a second-type layer and a second electrode, wherein at least one of the second-type layer, the intrinsic layer and the first-type layer is formed as a crystallized Si layer by an inductively coupled plasma chemical vapor deposition (ICP-CVD) device using mixed gas including hydrogen ($H_2$) gas and silane ($SiH_4$) gas, the mixed gas having a silane gas ($SiH_4$) in a ratio of 0.016 to 0.02.

In one embodiment of the present invention, the ICP-CVD device may use an ICP power ranging from about 1150 to about 1250 W.

In another embodiment of the present invention, in the forming of the first-type layer as the crystallized Si layer, a mixed gas including phosphine ($P_2H_3$) gas is used, wherein phosphine ($P_2H_3$) gas may be in a ratio of 0.075 to 0.1% relative to silane gas in the mixed gas.

In another embodiment of the present invention, in the forming of the second-type layer as the crystallized Si layer, a mixed gas including diborane is used, wherein the mixed gas includes 0.1 to 0.5% of diborane gas relative to silane gas.

In still another embodiment of the present invention, the method may include preparing a first-type Si substrate, forming a first electrode on a rear surface of the first-type Si substrate, and forming an intrinsic layer on a front surface of the first-type Si substrate, forming a second-type layer on the intrinsic layer, and forming a second electrode on the second-type layer.

In another embodiment of the present invention, the first electrode may include Ag, the second layer may include a hydrogenated second-type amorphous Si layer, and the second electrode includes a transparent electrode layer formed on the second-type layer, and a patterned aluminum (Al) electrode formed on the transparent electrode layer.

According to the present invention, the above and other objects and advantages may be realized.

In detail, the present invention provides a method for fabricating a solar cell using inductively coupled plasma chemical vapor deposition (ICP-CVD).

In addition, the present invention provides a method for forming a P layer of a solar cell.

Further, the present invention provides a method for forming a hydrogenised intrinsic layer of a solar cell.

In addition, the present invention provides a method for forming a microcrystallized intrinsic layer of a solar cell.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Hereinafter, embodiments of the present invention will be described in detail with reference to the accompanying drawings.

Figure 1:
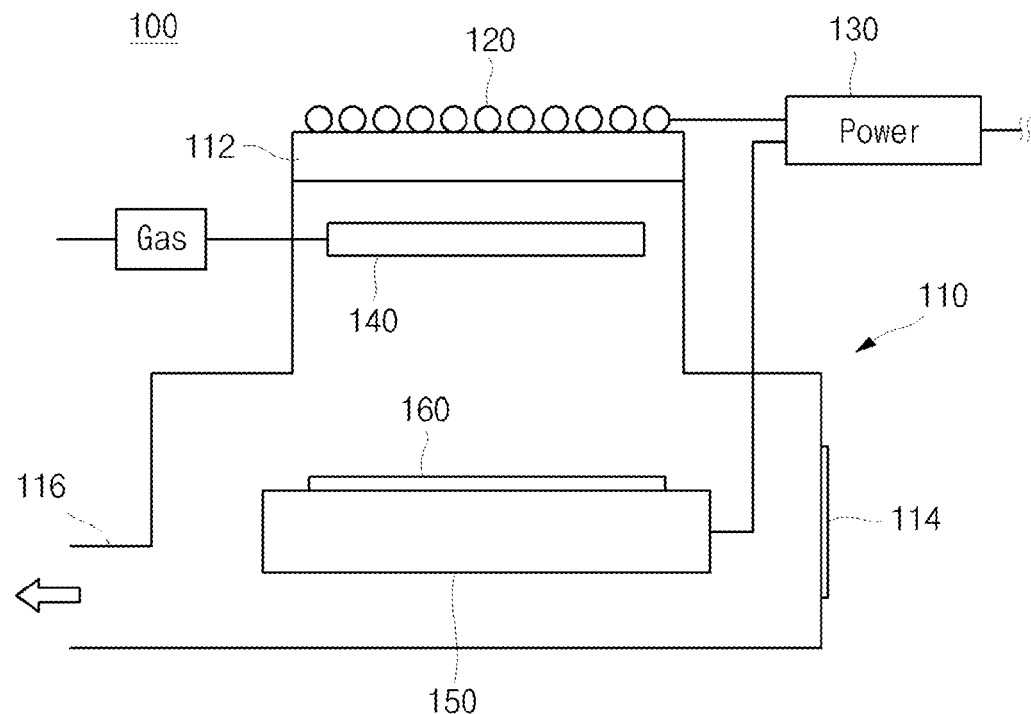
FIG. 1 is a conceptual diagram schematically illustrating a structure of an inductively coupled plasma chemical vapor deposition (ICP-CVD) device.

FIG. 1 is a conceptual diagram schematically illustrating a structure of an inductively coupled plasma chemical vapor deposition (ICP-CVD) device.

Referring to FIG. 1, the ICP-CVD 100 used in methods for fabricating solar cells according to embodiments of the present invention may include a chamber 110, an antenna 120, a power supply 130, a shower head 140 and a susceptor 150.

The chamber 110 may include an insulation plate 112, a door 114, and an exhaust pipe 116.

The chamber 110 isolates inside and outside of the chamber 110 to maintain the inside of the chamber 110 in a vacuum state.

The insulation plate 112 is provided at a top end of the chamber 110.

The insulation plate 112 insulates the antenna 120 from the chamber 110 and allows an electromagnetic field generated from the antenna 120 to transmit into the chamber 110.

The door 114 is provided to load/unload a substrate 60 into/from the chamber 110.

The exhaust pipe 116 is connected to a vacuum pump (not shown) to exhaust internal gases from the chamber 110 to evacuate the chamber 110 to reach a vacuum state or to maintain the chamber 110 at a vacuum state.

The antenna 120 receives power applied from the power supply 130 and generates high-density plasma in the chamber 110.

The antenna 120 is provided by helically winding a coil on the insulation plate 112 of the chamber 110.

The power supply 130 supplies power to the antenna 120 and the susceptor 150.

In particular, the power supply 130 applies 13.5 MHz RF to the antenna 120 to allow high-density plasma to be generated in the chamber 110.

The shower head 140 receives gases from a gas supply 142 provided outside the chamber 110 and uniformly supplies the gases into the chamber.

The shower head 140 homogenizes different kinds of gases supplied to the shower head 140 and produces uniformly mixed gas.

The susceptor 150 supports the substrate 160.

Although not illustrated in detail in FIG. 1, the susceptor 150 may include a heater or a cooler for heating or cooling the substrate 160 to a given temperature at the inside or outside thereof.

The susceptor 150 may be provided at a position where the substrate 160 and the shower head 140 are spaced a predetermined distance, preferably, 23 cm, apart from each other.

Figure 2:
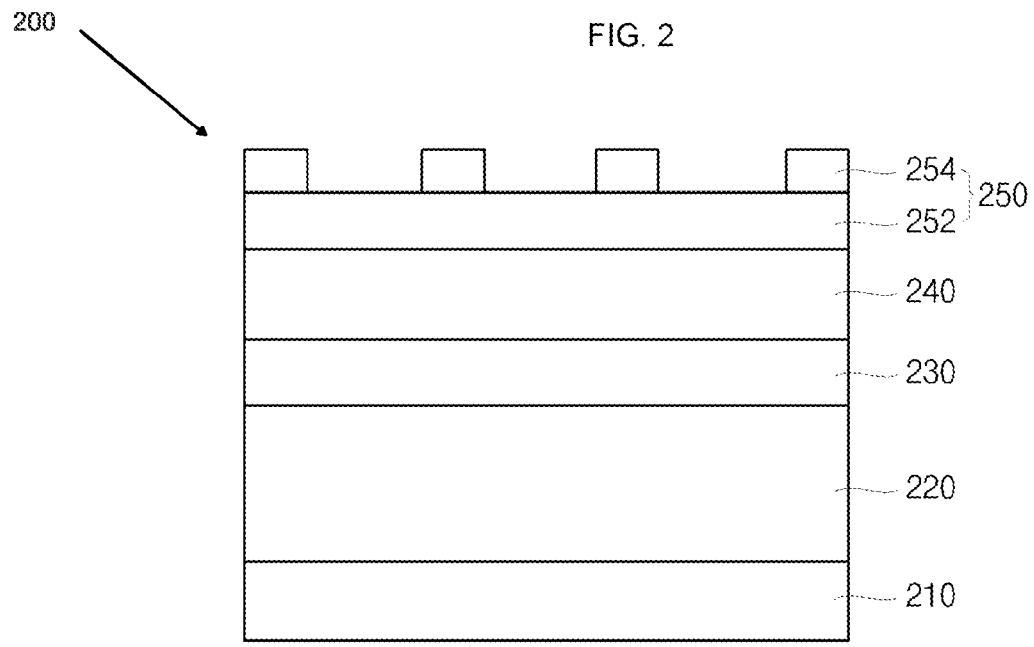
FIG. 2 is a sectional view illustrating a solar cell fabricated by a method for a solar cell according to an embodiment of the present invention.

FIG. 2 is a sectional view illustrating a solar cell fabricated by a method for a solar cell according to an embodiment of the present invention.

Referring to FIG. 2, the solar cell 200 fabricated by a method for a solar cell according to an embodiment of the present invention may a first electrode 210, a first-type Si substrate 220, an intrinsic layer 230, a second-type layer 240 and a second electrode 250.

Here, the first-type Si substrate 220 may be an N-type Si substrate or a P-type Si substrate.

In addition, the second-type layer 240 may be a P layer when the first-type Si substrate 220 is an N-type Si substrate. Alternatively, the second-type layer 240 may be an N layer when the first-type Si substrate 220 is a P-type Si substrate.

In the following explanation, this embodiment will be described assuming that the first-type Si substrate 220 is an N-type Si substrate and the second-type layer 240 is a P layer.

That is to say, in the following explanation, assumptions are made that the first-type is an N type, and the second-type is a P type.

Here, the second electrode 250 includes a transparent electrode layer 252 and a metal electrode 254.

In view of the first-type Si substrate 220, the solar cell 200 includes the first electrode 210 formed on a rear surface of the first-type Si substrate 220 and includes the intrinsic layer 230, the second-type layer 240 and the second electrode 250 sequentially stacked on a front surface of the first-type Si substrate 220.

The first electrode 210 is a rear electrode provided on the rear surface of the first-type Si substrate 220 and may be a conductive material, preferably Ag.

The first electrode 210 may have a thickness ranging from about 0.3 to about 0.8 μm, preferably about 0.5 μm.

The first-type Si substrate 220 may be a first-type impurity doped Si substrate, specifically, a single crystal substrate doped with a first type impurity.

The first-type Si substrate 220 may have a thickness ranging from about 300 to about 1000 μm, preferably about 650 μm.

The intrinsic layer 230 may be an undoped hydrogenated amorphous Si layer, i.e., an I a-Si:H layer. In addition, the intrinsic layer 230 may be an undoped hydrogenated microcrystallized Si layer, i.e., an I μc-Si:H layer. When the intrinsic layer 230 is the I a-Si:H layer, its thickness may range from about 3 to about 5 nm, preferably 5 nm. When the intrinsic layer 230 is the I μc-Si:H layer, its thickness may range from about 0.5 to about 2 μm, preferably 1 μm.

The second-type layer 230 may be a second-type impurity doped hydrogenated amorphous carbide Si layer, that is, a second-type a-SiC:H layer. In addition, the second-type layer 230 may be a second-type impurity doped hydrogenated amorphous Si layer, that is, a P a-Si:H layer.

When the second-type layer 230 is the second-type a-SiC:H layer, its thickness may range from about 10 to about 20 nm, preferably 12 nm. In addition, when the second-type layer 230 is the second-type a-Si:H layer, its thickness may range from about 11 to about 12 nm, preferably 12 nm.

The transparent electrode layer 252 of the second electrode 250 may be a TCO (Transparent Conducting Oxide) such as ZnO (Zinc Oxide), AZO (Aluminum Zinc Oxide), ITO (Indium Tin Oxide), $SnO_2$:F, and so on.

The transparent electrode layer 252 of the second electrode 250 may have a thickness ranging from about 100 to about 200 nm, preferably 120 nm.

The metal electrode 254 of the second electrode 250 is disposed on the transparent electrode layer 252 and may include a patterned metal electrode 254.

The metal electrode 254 may be made of a conductive material such as aluminum (Al).

The metal electrode 254 may have a thickness ranging from about 0.2 to about 10 μm, preferably 0.5 μm.

Figure 3:
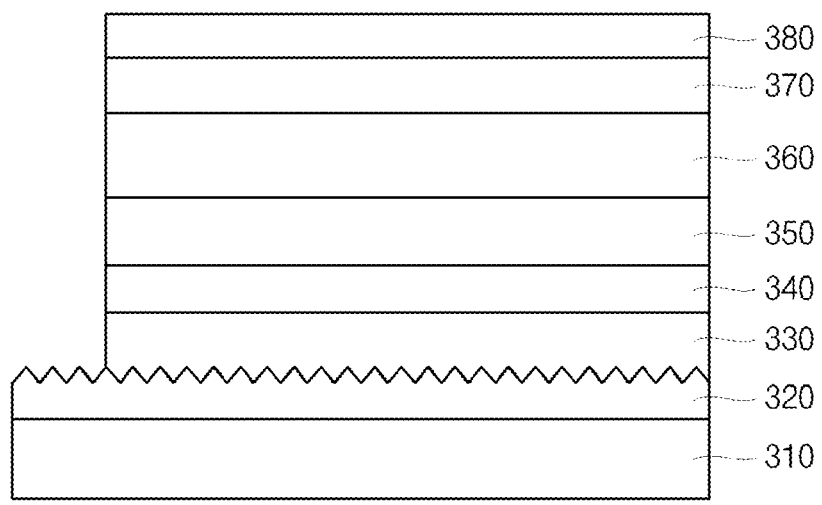
FIG. 3 is a sectional view illustrating a solar cell fabricated by a method for a solar cell according to another embodiment of the present invention.

FIG. 3 is a sectional view illustrating a solar cell fabricated by a method for a solar cell according to another embodiment of the present invention.

Referring to FIG. 3, the solar cell 300 may include a transparent substrate 310, a first electrode 320, a second-type layer 330, a buffer layer 340, an intrinsic layer 350, a first-type layer 360, a transparent electrode layer 370 and a second electrode 380.

The solar cell 300 includes the first electrode 320, the second-type layer 330, the buffer layer 340, the intrinsic layer 350, the first-type layer 360, the transparent electrode layer 370 and the second electrode 380 sequentially stacked on the transparent substrate 310.

The transparent substrate 310 may be a glass substrate or a plastic substrate serving as an insulator while capable of transmitting light.

The first electrode 320 may be TCO (Transparent Conducting Oxide), which is an optically transparent and conductive material, for example, ZnO, AZO, ITO and $SnO_2$:F.

The first electrode 320 may have roughness on its surface by texture treatment.

The second-type layer 330 may be a P-type impurity doped hydrogenated amorphous Si carbide layer, that is, a second-type a-SiC:H layer. Alternatively, the second-type layer 330 may be a second-type impurity doped hydrogenated amorphous Si layer, that is, a second-type a-Si:H layer.

When the second-type layer 330 is the second-type a-SiC:H layer, its thickness may range from about 10 to about 20 nm, preferably 12 nm. In addition, when the second-type layer 330 is the second-type a-Si:H layer, its thickness may range from about 11 to about 12 nm, preferably 12 nm.

The buffer layer 340 is provided as a buffer between the second-type layer 330 and the intrinsic layer 340, and may include a second-type impurity doped hydrogenated amorphous Si layer, that is, a second-type a-Si:H layer.

The buffer layer 340 may have a thickness ranging from about 2 to about 5 mm preferably 3 mm.

The intrinsic layer 350 may be an undoped hydrogenated amorphous Si layer, i.e., an I a-Si:H layer. In addition, the intrinsic layer 350 may be an undoped hydrogenated microcrystallized Si layer, i.e., an I μc-Si:H layer. When the intrinsic layer 350 is the I a-Si:H layer, its thickness may range from about 3 to about 5 nm, preferably 5 nm. When the intrinsic layer 350 is the I μc-Si:H layer, its thickness may range from about 0.5 to about 2 μm, preferably 1 μm.

The first-type layer 360 may be a first-type impurity doped hydrogenated amorphous Si layer, that is, a first-type a-Si:H layer. In addition, the first-type layer 360 may be a first-type impurity doped hydrogenated microcrystallized Si layer, that is, a first-type μc-Si:H layer.

The first-type layer 360 may have a thickness ranging from about 20 to about 60 nm, preferably about 40 nm.

The transparent electrode layer 370 may be a TCO (Transparent Conducting Oxide) such as ZnO (Zinc Oxide), AZO (Aluminum Zinc Oxide), ITO (Indium Tin Oxide), $SnO_2$:F, and so on.

The transparent electrode layer 370 may have a thickness ranging from about 100 to about 200 nm, preferably about 120 nm.

The second electrode 380 may be made of a conductive material such as aluminum (Al).

Figure 4:
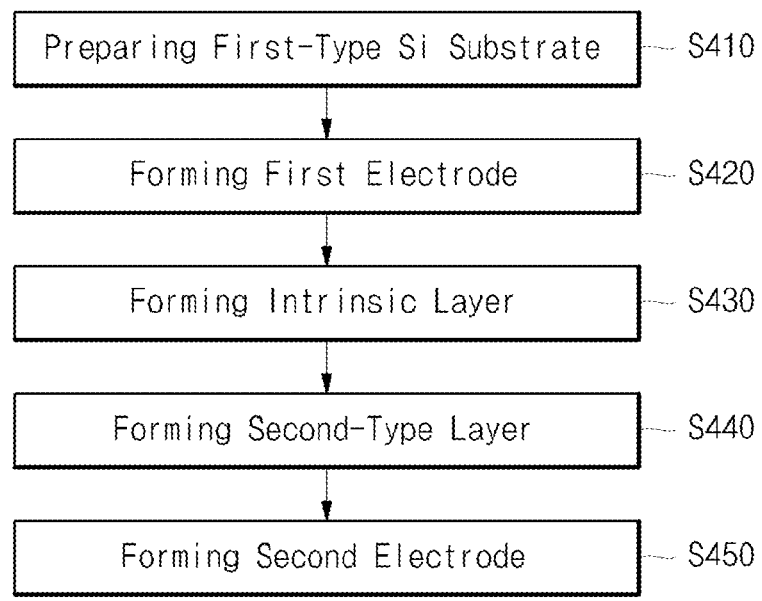
FIG. 4 is a flowchart illustrating a sequential process of the method for a solar cell according to an embodiment of the present invention.

FIG. 4 is a flowchart illustrating a sequential process of the method for a solar cell according to an embodiment of the present invention.

Referring to FIG. 4, the method for a solar cell according to an embodiment of the present invention may include preparing the first-type Si substrate (S410), forming the first electrode (S420), forming the intrinsic layer (S430), forming the second-type layer (S440), and forming the second electrode (S450).

Here, the method for a solar cell according to an embodiment of the present invention will be described with regard to the solar cell 200 illustrated in FIG. 2.

In S410, the first-type Si substrate 220 is prepared. The first-type Si substrate 220 may be a single crystal Si substrate grown by the Czochralski method. S410 may include washing the first-type Si substrate 220 and removing an oxide layer. The first-type Si substrate 220 is washed in a mixture solution containing sulfuric acid and hydrogen peroxide in a ratio of 4:1 maintained at a temperature of 120 for about 10 minutes. Then, the oxide layer is removed by immersing the first-type Si substrate 220 in a BOE (Buffered Oxide Etchant) for about 10 seconds.

S410 further includes drying the first-type Si substrate 220. That is to say, in the course of carrying out the washing and removing oxide layer, moisture may be adsorbed into the first-type Si substrate 220. Accordingly, it is necessary to perform drying the moisture the adsorbed moisture. The drying may be performed by loading the first-type Si substrate 220 into a vacuum chamber and heating the same at about 200 for about 2 hours in a deoxidized state.

In S420, the first electrode 210 is formed by depositing a conductive material, for example, Ag, and a metal, on a rear surface of the first-type Si substrate 220. The depositing of the conductive material, for example, Ag, may include a physical vapor deposition (PVD) such as an evaporation method or a sputtering method.

In S430, a first-type and a second-type undoped intrinsic Si layers are formed on an entire surface of the first-type Si substrate 220.

In S430, the ICP-CVD device 100 shown in FIG. 1 may be used. Alternatively, another CVD device, such as a plasma enhanced chemical vapor deposition (PECVD) device, may be used.

In the following explanation, this embodiment will be described assuming that the intrinsic layer 230 is formed using the ICP-CVD device 100.

In addition, the intrinsic layer 230 may be formed using the ICP-CVD device 100 employing mixed gas containing hydrogen ($H_2$) gas and silane ($SiH_4$) gas.

The mixed gas has a hydrogen-to-silane ($H_2/SiH_4$) ratio of 8 to 10.

In addition, S430 is performed under processing conditions including a working pressure ranging from about 70 to about 90 mtorr, ICP power ranging from about 200 to about 300 W, and a substrate temperature ranging from about 250 to about 350° C.

The following Experimental Examples 1 to 3 are carried out to select optimal processing conditions for forming the intrinsic layer 230 using the ICP-CVD device 100.

Experimental Example 1

Figure 5:
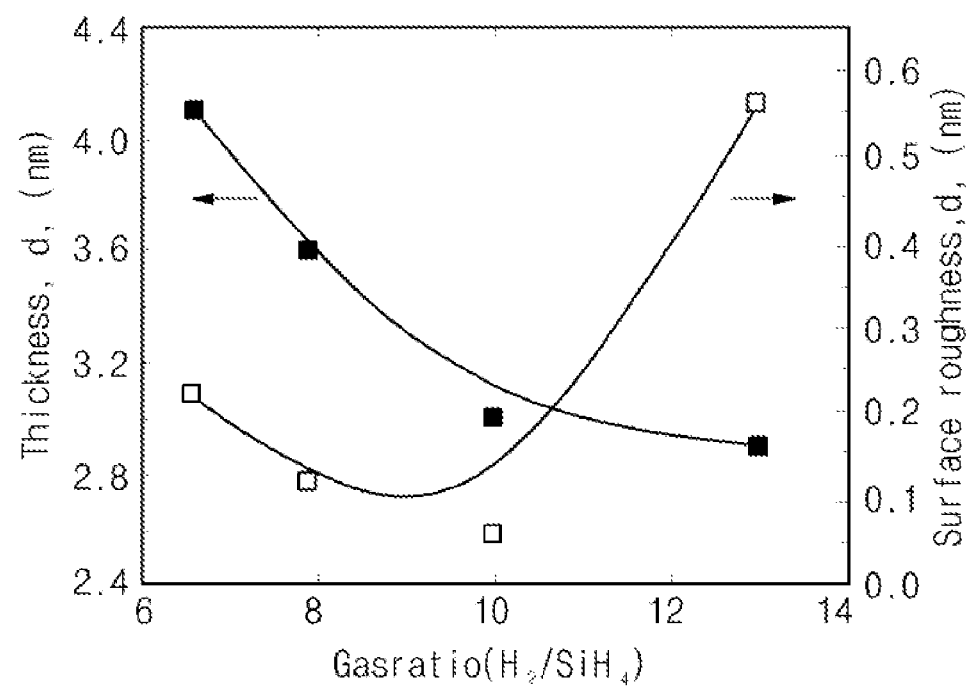
FIG. 5 is a graph illustrating changes in intrinsic layer thickness and surface roughness of depending on mixed gas ($H_2/SiH_4$) ratio.

FIG. 5 is a graph illustrating changes in intrinsic layer thickness and surface roughness of depending on mixed gas ($H_2/SiH_4$) ratio.

Figure 6:
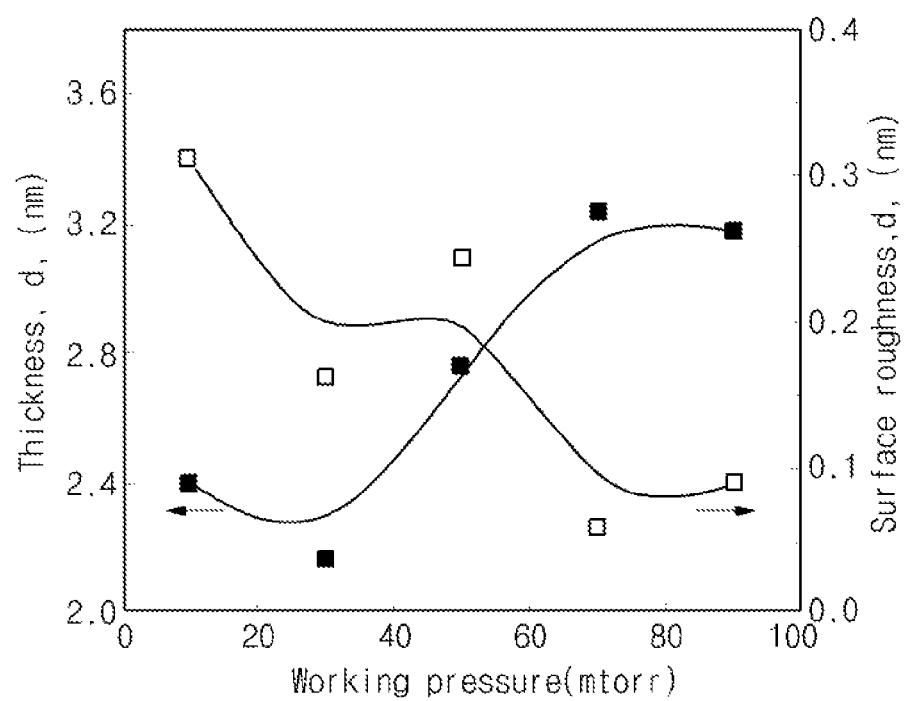
FIG. 6 is a graph illustrating changes in intrinsic layer thickness and surface roughness depending on working pressure.

FIG. 6 is a graph illustrating changes in intrinsic layer thickness and surface roughness depending on working pressure.

Referring to FIGS. 5 and 6, thicknesses and surface roughness of the intrinsic layer 230 were measured using a stylus profiler and a scanning probe microscope, respectively, with varying the mixed gas ($H_2/SiH_4$) ratio and working pressure. In selecting the optimal processing conditions of $H_2/SiH_4$ ratio, processing time, working pressure, ICP power, and substrate temperature were set to 10 sec, 70 mTorr, 300 W and 100, respectively. In selecting the optimal processing conditions of working pressure, the other conditions including $H_2/SiH_4$ ratio, processing time, working pressure, and substrate temperature were set to 10, 10 sec, 300 W, and 100, respectively.

As shown in FIG. 5, as the content of hydrogen gas increases, the thickness is gradually reduced and the surface roughness is reduced and then increases again. This suggests that adding an appropriate amount of hydrogen gas plays an important role in making the surface roughness uniform, that is, effectively removing radicals generated on the surface and weak bonds due to etching.

Thus, the $H_2/SiH_4$ ratio is preferably in a range of 8 to 10, inn which the intrinsic layer 230 is relatively thick and the surface roughness is relatively low.

In this case, when the $H_2/SiH_4$ ratio is 10, the intrinsic layer 230 having a relatively high thickness can be formed while high surface roughness.

As shown in FIG. 6, when the working pressure is 0.1 torr or below, the intrinsic layer 230 exhibits its desirable features in a range of about 70 to about 90 mtorr, where the intrinsic layer 230 is relatively thick and has low surface roughness, as compared to in other working pressure. Here, the most preferred working pressure is 90 mtorr, in which the intrinsic layer 230 exhibits its best features.

Experimental Example 2

Figure 7:
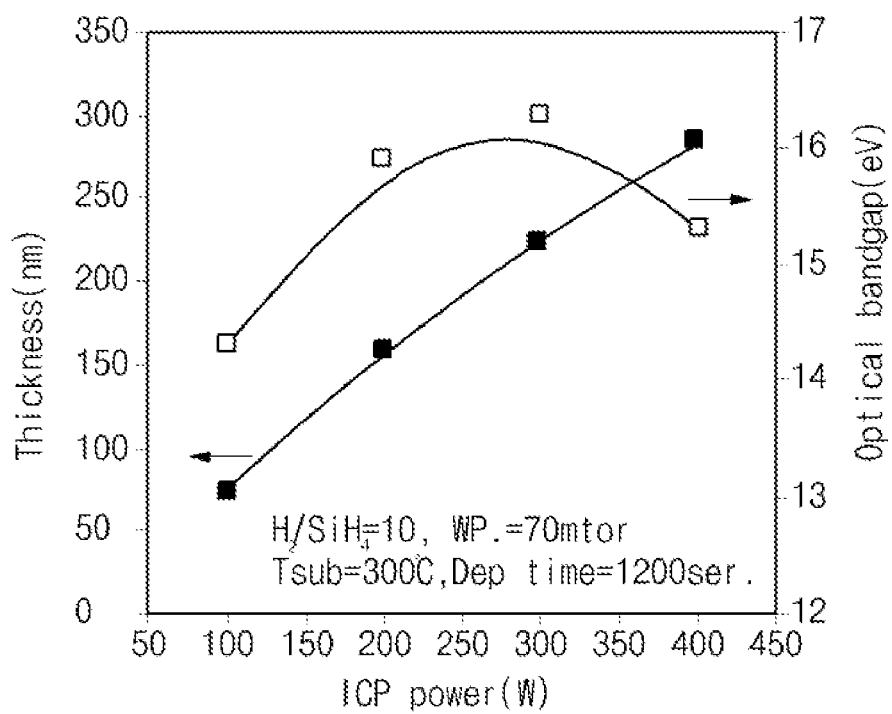
FIG. 7 is a graph illustrating changes in intrinsic layer thickness and optical bandgap depending on ICP power.

FIG. 7 is a graph illustrating changes in intrinsic layer thickness and optical bandgap depending on ICP power.

Figure 8:
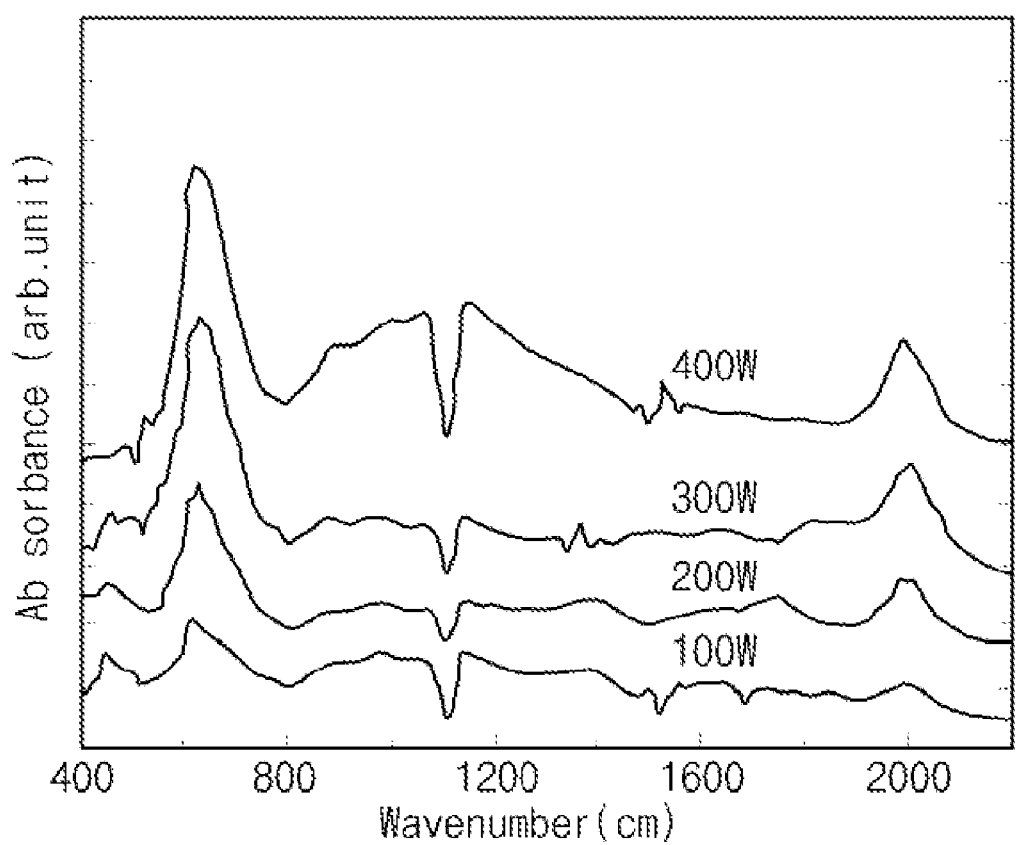
FIG. 8 is a graph illustrating a change based on FTIR Spectroscopy analysis depending on ICP power.

FIG. 8 is a graph illustrating a change based on FTIR Spectroscopy analysis depending on ICP power.

Referring to FIGS. 7 and 8, the mixed gas ($H_2/SiH_4$) ratio, processing time, working pressure and substrate temperature were set to 10, 1200 sec, 10, 1200 sec, 70 mTorr and 300 with varying ICP power to investigate optimal ICP power. As a result, when the ICP power is in a range of 200 to 300 W, the intrinsic layer 230 exhibiting the superb feature could be obtained.

As the ICP power increases, the thickness of the intrinsic layer 230 is linearly increased, which suggests more radicals are generated according to the increase of the ICP power increases.

In order to use the intrinsic layer 230 for use in the solar cell 200, the optical bandgap is preferably in a range of about 1.6 to about 1.8 eV, the dark conductivity is preferably in a range of about $10^9$ to about $10^{10}$ S/cm, and the photoconductivity is preferably in a range of about $10^4$ to about $10^5$ S/cm.

Accordingly, as confirmed from the graph shown in FIG. 7, when the ICP power is in a range of 200 to 300 W, preferably 300 W, the best data is obtained.

As shown in FIG. 8, when the ICP power is in a range of 200 to 300 W, few defects are demonstrated at a absorption peak of about 2000 $cm^{-1}$ in the Si—H stretching area, which suggests that even when the power is increased, a thin film is not damaged but is bonded with relatively fewer Si radicals. As such, high quality intrinsic layer 230 is attainable.

Experimental Example 3

Figure 9:
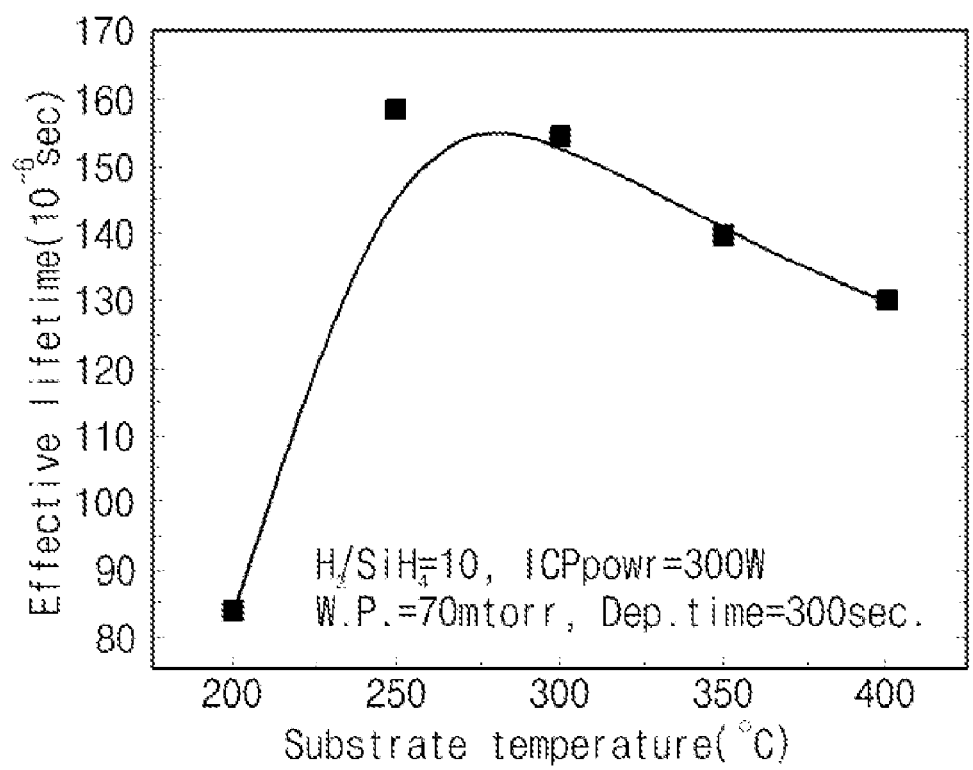
FIG. 9 is a graph illustrating a change in effective lifetime of carriers in intrinsic layer depending on surface temperature.

FIG. 9 is a graph illustrating a change in effective lifetime of carriers in intrinsic layer depending on surface temperature.

Referring to FIG. 9, the mixed gas ($H_2/SiH_4$) ratio, processing time, working pressure and ICP power were set to 10, 1200 sec, 70 mTorr and 300 W with varying substrate temperature to investigate optimal substrate temperature. As a result, when the optimal substrate temperature is in a range of 250 to 350, the intrinsic layer 230 exhibiting the superb feature could be obtained.

As shown in FIG. 9, as the substrate temperature increases, the carrier lifetime is high, specifically, the longest lifetime of about 160 ns.

Here, the lifetime of carrier was measured using QSSPCD (Quasi-steady state photoconductivity decay method.

Accordingly, in forming the intrinsic layer 230, the substrate temperature is preferably in a range of about 250 to about 350.

Referring back to FIG. 4, the method for fabricating the solar cell 200 will further be described. After S430, the second-type layer is formed in S440.

In S440, the second-type layer 240 is formed on the intrinsic layer 230.

Like the intrinsic layer 230, the second-type layer 240 may be formed using a CVD device, such as a plasma enhanced chemical vapor deposition (PECVD) device, may be used.

In addition, second-type doped hydrogenated amorphous Si layer, that is, a second-type a-Si:H layer 240 may be formed using the ICP-CVD device 100.

In the following explanation, this embodiment will be described assuming that the second-type layer 240 is formed using the ICP-CVD device 100.

In S440, a second-type doped hydrogenated amorphous Si layer, that is, a second-type a-Si:H layer, may be formed by adding diborane ($B_2H_6$) gas under the processing conditions described above in S430.

In addition, in S440, a second-type doped hydrogenated amorphous carbide Si layer may be formed as a second-type a-SiC:H layer using mixed gas containing hydrogen ($H_2$) gas, silane ($SiH_4$) gas, diborane ($B_2H_6$) and ethylene ($C_2H_4$) gas.

Experimental Example 4

Figure 10:
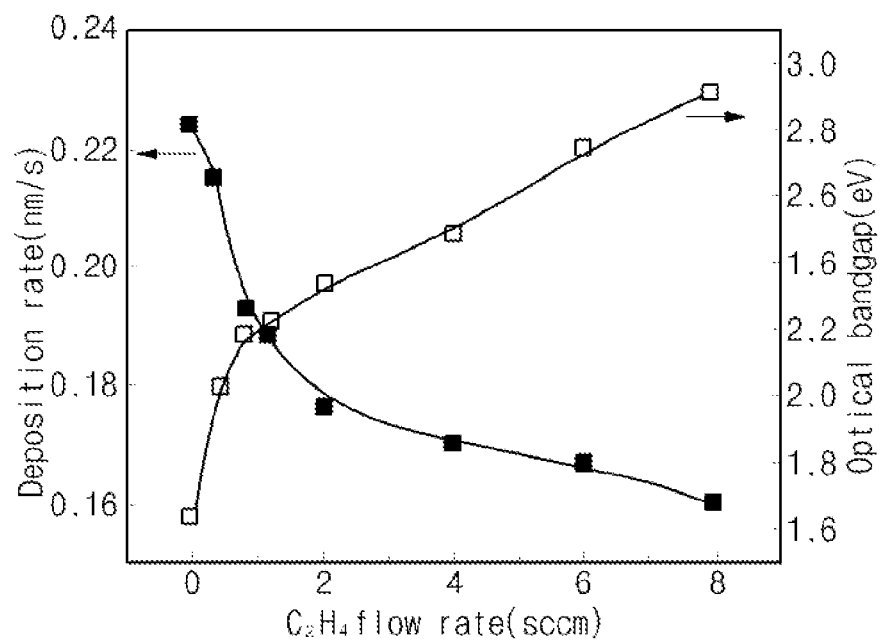
FIG. 10 is a graph illustrating changes in deposition rate and optical bandgap depending on the flow rate of ethylene gas of a hydrogenated amorphous Si carbide thin film.

FIG. 10 is a graph illustrating changes in deposition rate and optical bandgap depending on the flow rate of ethylene gas of a hydrogenated amorphous Si carbide thin film.

Figure 11:
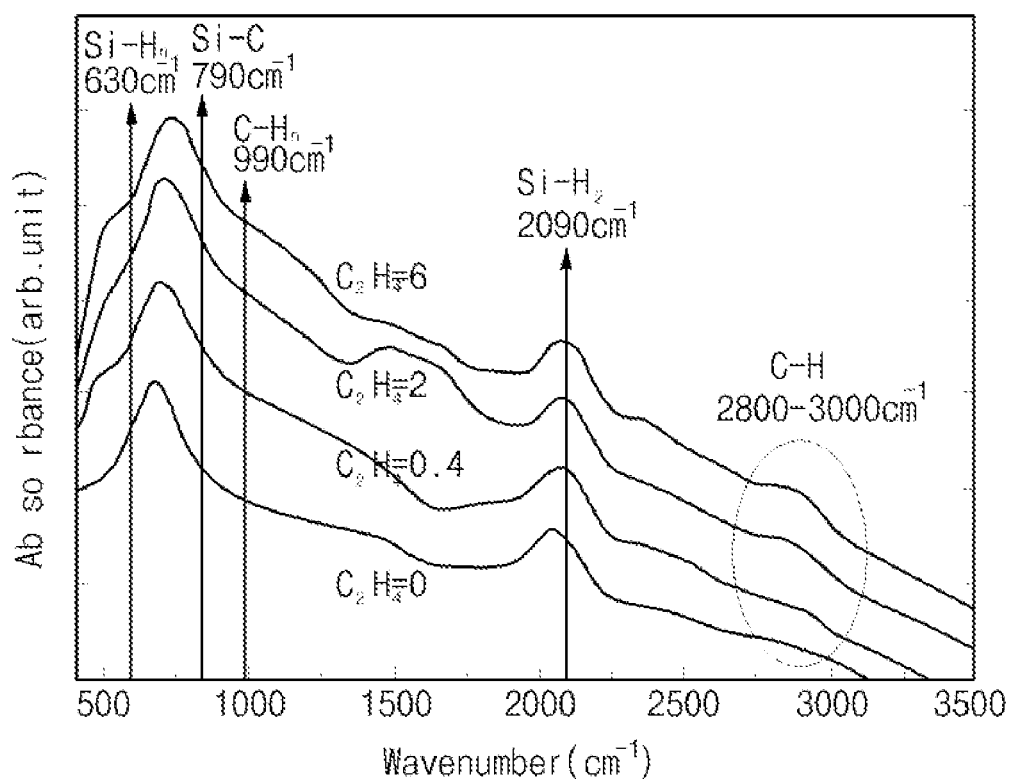
FIG. 11 is a graph illustrating changes in binding structure and optical bandgap depending on the flow rate of ethylene gas of a hydrogenated amorphous Si carbide thin film.

FIG. 11 is a graph illustrating changes in binding structure and optical bandgap depending on the flow rate of ethylene gas of a hydrogenated amorphous Si carbide thin film.

Referring to FIGS. 10 and 11, first, a $H_2/SiH_4$ ratio of mixed gas in which ethylene gas is to be contained, ICP power, and substrate temperature were set to 6, 600 W and 250.

With increasing the content of the ethylene gas diluted with 60% hydrogen gas in a range of 0 sccm to 8 sccm, the ethylene gas was mixed with the mixed gas. Here, the overall flow rate of the mixed gas containing the ethylene gas was set to 100 sccm.

The deposition rate and optical bandgap were measured using a stylus profiler and a scanning probe microscope, respectively.

As a mixture ratio of the ethylene gas increases, the deposition rate is gradually reduced and the optical bandgap increases until it reaches 2.9 eV. This suggests that the reduced deposition rate is caused due to etching of weak bond groups by hydrogen atoms contained in the ethylene gas and defects due to doping of carbon and hydrogen in the amorphous Si layer are removed, increasing the bandgap. With adding ethylene gas, Si—C and C—H peaks observed at 790 $cm^{-1}$ and 2800 to 3000 $cm^{-1}$ gradually move and increase.

In addition, a defective Si—$H_2$ peak is observed at 2090 $cm^{-1}$ and its intensity gradually increases. Generally, when the ethylene gas ratio is about $10^{-2}$, that is, 1 to 1.2%, based on the overall gas flow rate, the ethylene gas exhibits the superb features.

Experimental Example 5

Figure 12:
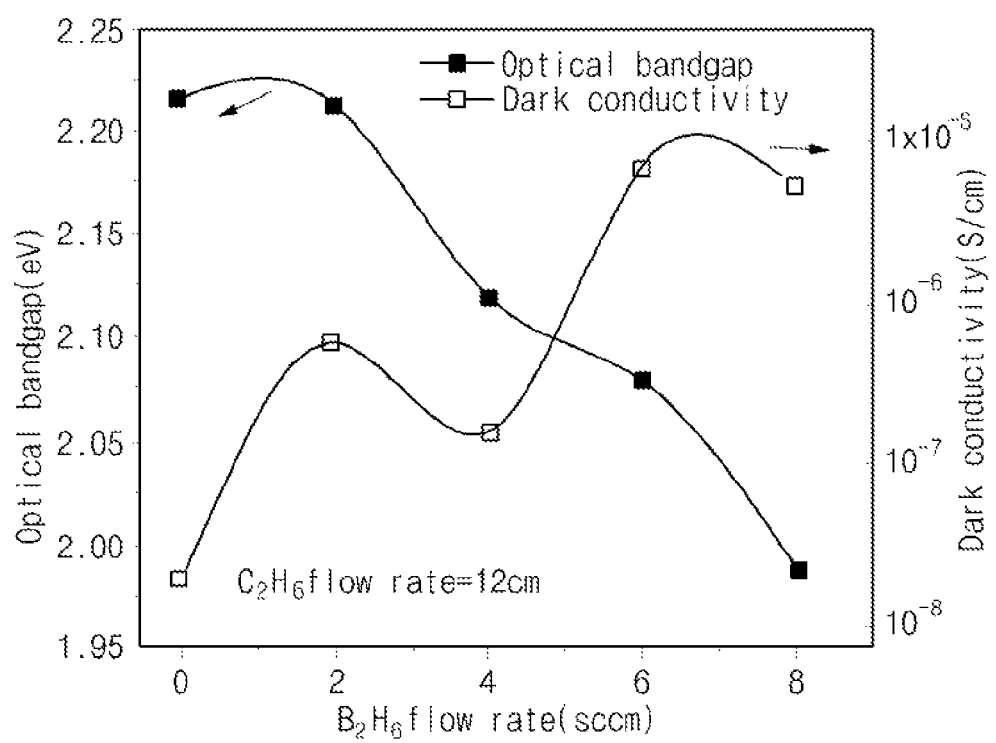
FIG. 12 is a graph illustrating changes in optical bandgap and dark conductivity depending on the flow rate of diborane gas of a hydrogenated amorphous Si carbide layer doped with a second-type layer.

FIG. 12 is a graph illustrating changes in optical bandgap and dark conductivity depending on the flow rate of diborane gas of a hydrogenated amorphous Si carbide layer doped with a second-type layer.

The following Experimental Examples 4 and 5 are carried out to select optimal mixing conditions of mixed gas including the second-type a-SiC:H layer using the ICP-CVD device 100.

Figure 13:
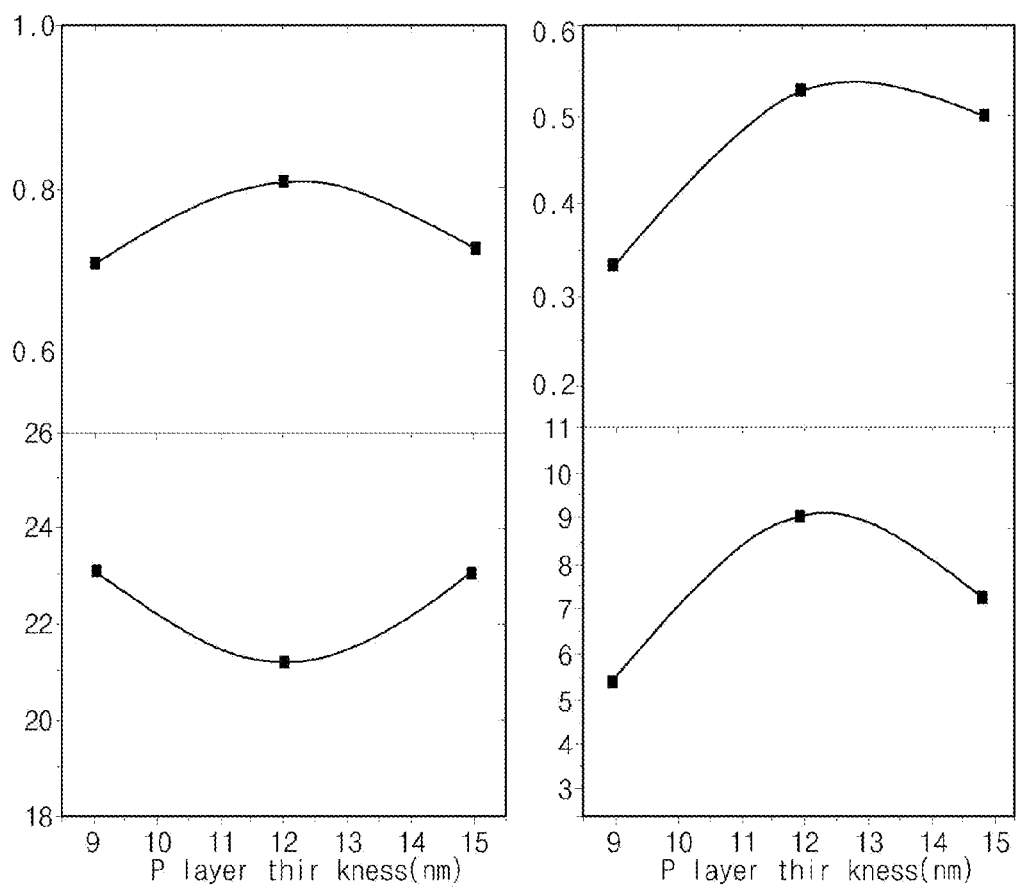
FIG. 13 is a graph illustrating changes in characteristics of a solar cell depending on the thickness of a hydrogenated amorphous Si carbide layer doped with a second-type layer.

FIG. 13 is a graph illustrating changes in characteristics of a solar cell depending on the thickness of a hydrogenated amorphous Si carbide layer doped with a second-type layer.

Referring to FIGS. 12 and 13, the flow rate of ethylene gas was set to 1.2 sccm, and the other processing conditions are maintained under the same conditions. diborane gas is mixed in a range of 0 sccm to 8 sccm and mixed with mixed gas.

Here, the diborane gas is 97% hydrogen gas diluted diborane gas.

As the diborane gas increases, the bandgap is reduced from 2.2 eV to 1.98 eV, suggesting that defects are generated due to boron atoms doped into the increased bandgap In addition, the dark conductivity is increased up to $5 \times 10^{-6}$ S/cm. When the diborane gas is mixed at a rate of about 6 sccm, that is, when the diborane gas ratio (diborane gas/ overall gas flow rate) is in a range of 6 to 6.5%, the best feature is demonstrated.

Further, the open voltage, current density, fidelity, and conversion efficiency are evaporated with varying the thickness in a range of 9 to 15 nm as the second-type layer 240 of a solar cell under the processing conditions, and data of 0.81V, 21.1 mA/cm$^2$, 0.53 and 9.08% were obtained, respectively, when the thickness is about 12 nm.

Referring back to FIG. 4, the method for fabricating the solar cell 200 will further be described. After S440, the second electrode is formed in S450.

In S450, the transparent electrode layer 252 is formed on the second-type layer 240 and a patterned metal electrode 254 is formed on the transparent electrode layer 252.

The transparent electrode layer 252 may be a TCO (Transparent Conducting Oxide) such as ZnO (Zinc Oxide), AZO (Aluminum Zinc Oxide), ITO (Indium Tin Oxide), SnO$_2$:F, and so on.

In addition, the metal electrode 254 may be formed by PECVD using a conductive material such as aluminum (Al), patterning the same. Alternatively, a patterned metal electrode 254 may be formed using a PECVD using a pattern mask.

Figure 14:
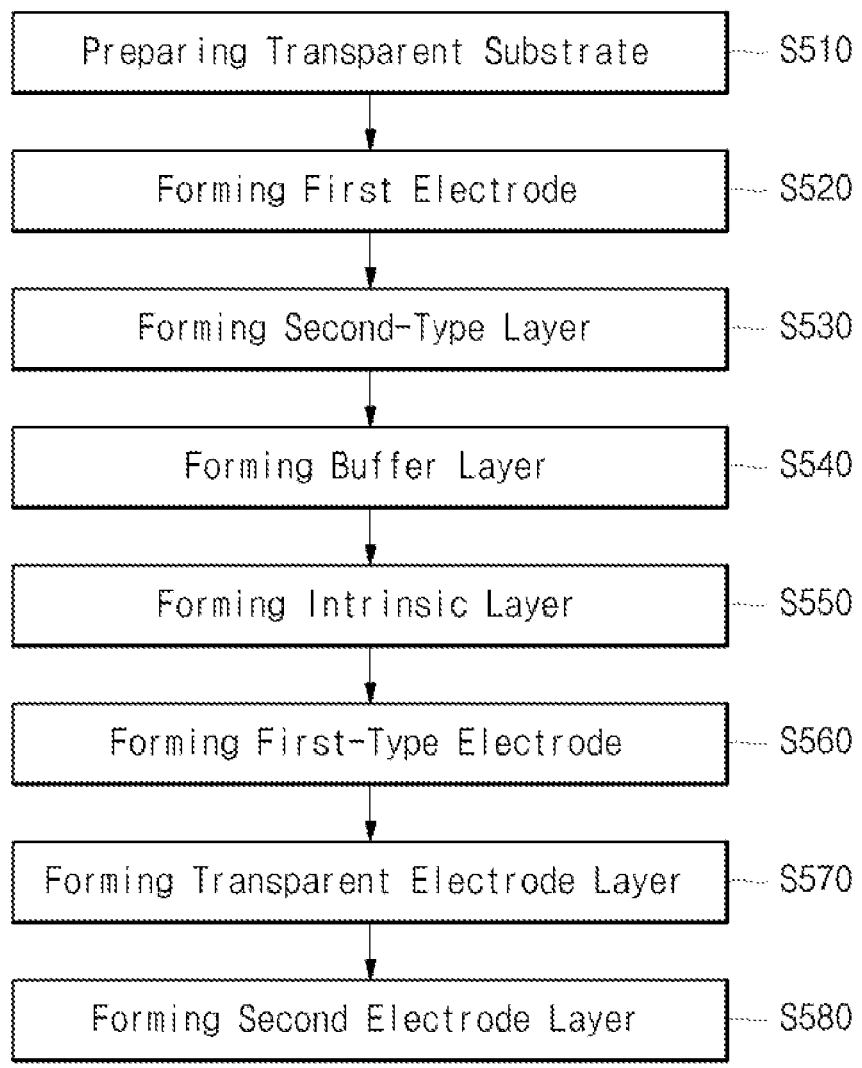
FIG. 14 is a flowchart illustrating a sequential process of the method for a solar cell according to another embodiment of the present invention.

FIG. 14 is a flowchart illustrating a sequential process of the method for a solar cell according to another embodiment of the present invention.

Referring to FIG. 14, the method for a solar cell according to another embodiment of the present invention may include preparing a transparent substrate (S510), forming a first electrode (S520), forming a second-type layer (S530), forming a buffer layer (S540), forming an intrinsic layer (S550), forming a first-type electrode (S560), forming a transparent electrode layer (570) and forming a second electrode layer (S580).

Here, the method for a solar cell according to an embodiment of the present invention will be described with regard to the solar cell 300 illustrated in FIG. 3.

In S510, the transparent substrate 310 is prepared. The transparent substrate 310 may be a glass substrate or a plastic substrate, which is transparent and serves as an insulator. S510 may include removing an organic matter. That is to say, in S510, organic matter is removed from the transparent substrate 310 using TCE (tri chloro ethylene), acetone and methanol. S510 further includes drying the transparent substrate 310 moisture adsorbed thereinto in the course of removing the organic matter. The drying may be performed by loading the transparent substrate 310 into a vacuum chamber and heating the same at about 200 for about 2 hours in a deoxidized state.

In S520, the first electrode 310 including a TCO layer is formed on the transparent substrate 310. The TCO layer may be formed by depositing ZnO (Zinc Oxide), AZO (Aluminum Zinc Oxide), ITO (Indium Tin Oxide), SnO$_2$:F, and so on, using a PVD device or a CVD device.

Here, the first electrode 310 may be subjected to a texture treatment by a wet process using dilute choric acid.

The first electrode 310 includes a plurality of protrusions on its surface by texture treatment, preferably pyramidal protrusions.

In S530, the second-type layer is formed. That is to say, the second-type layer 330 is formed on the first electrode 310. This step is performed in substantially the same manner as S440, and a detailed explanation will not be given.

S540 is performed sequentially with S530. That is, the buffer layer 340 is formed to be doped at a lower concentration than the second-type impurity for forming the second-type layer 330.

Therefore, S540 is performed in place of reducing the content of a second-type gas, for example, diborane (B$_2$H$_6$) gas, in S530, and a detailed explanation will not be given.

S550 may be performed in substantially the same manner as S440, and a detailed explanation will not be given.

In S550, an undoped hydrogenated microcrystallized Si layer, i.e., an I μc-Si:H layer, is formed.

The following Experimental Example 6 is carried out to select optimal conditions of mixed gas and working pressure for forming the intrinsic layer 350 as an undoped hydrogenated microcrystallized Si layer, i.e., an I μc-Si:H layer second-type a-SiC:H layer, using the ICP-CVD device 100.

Experimental Example 6

Figure 15:
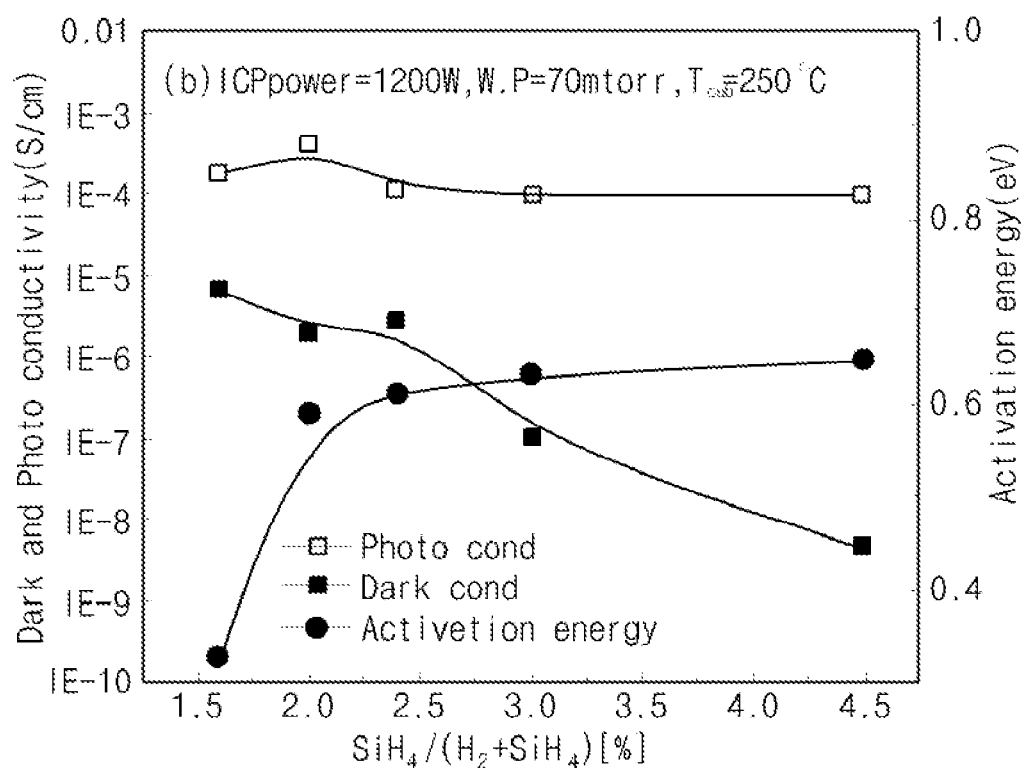
FIG. 15 is a graph illustrating changes in dark and photo conductivity and activation energy of a hydrogenated amorphous Si carbide layer of an intrinsic layer depending on the concentration of silane gas.

FIG. 15 is a graph illustrating changes in dark and photo conductivity and activation energy of a hydrogenated amorphous Si carbide layer of an intrinsic layer depending on the concentration of silane gas.

Figure 16:
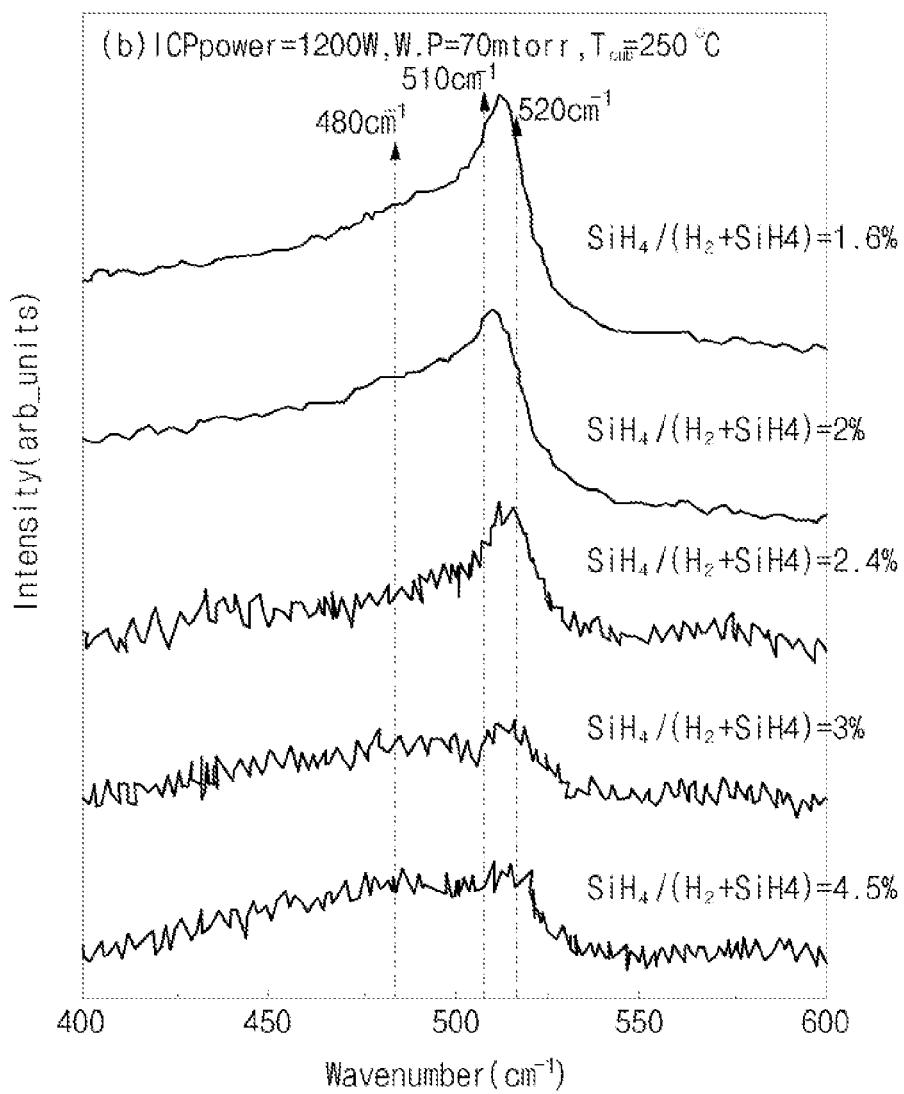
FIG. 16 is a graph illustrating changes in crystallization peak and amorphous peak dark and depending on the concentration of silane gas.

FIG. 16 is a graph illustrating changes in crystallization peak and amorphous peak dark and depending on the concentration of silane gas.

Figure 17:
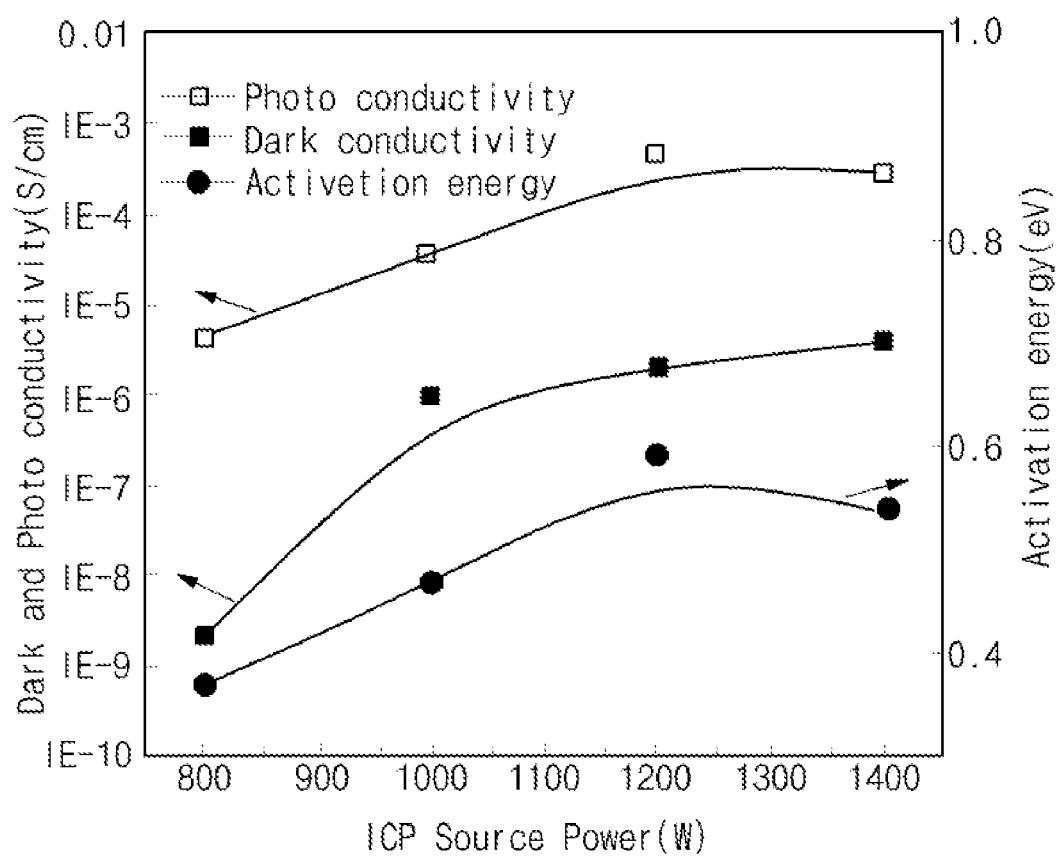
FIG. 17 is a graph illustrating changes in electrical characteristics of a hydrogenated microcrystallized Si layer of an intrinsic layer depending on ICP source power.

FIG. 17 is a graph illustrating changes in electrical characteristics of a hydrogenated microcrystalline Si layer of an intrinsic layer depending on ICP source power.

Referring to FIGS. 15 to 17, a ratio of silane gas based on mixed gas containing silane gas and hydrogen gas, that is, SiH$_4$/(SiH$_4$+H$_2$), was increased in a range from 0.016 to 0.045, with varying ICP power in a range of about 800 to about 1400 W.

As shown in FIGS. 15 and 16, the dark and photo conductivity and activation energy of a hydrogenated amorphous Si carbide layer of an intrinsic layer were measured depending on the concentration of silane gas. Here, the ICP power, working pressure, and substrate temperature were set to 1200 W, 70 mtorr and 250.

When the silane gas ratio was in a range of 0.016 to 0.02, the photo conductivity was highest and the satisfactory activation energy was demonstrated.

In other words, as the silane gas ratio is reduced, that is, as the flow rate of silane gas is increased, the intensity of crystallization peak of 520 cm$^{-1}$ is weakened while the peak intensity of 480 cm$^{-1}$ increases.

When the silane gas ratio is 0.02, the degree of crystallization was about 68%.

As shown in FIG. 17, when the ICP power was in a range of about of 1150 to about 1250 W, the photo conductivity was highest and the satisfactory activation energy was demonstrated.

Here, the second-type layer 330 and the first-type layer 360 may also be formed as a microcrystallized Si layer.

The following Experimental Example 7 is carried out to select optimal mixing conditions of mixed gas for forming the second-type layer 330 and the first-type layer 360 as a second-type and a first-type impurity doped hydrogenated microcrystallized Si layers, that is, a second-type type and a first-type μc-Si:H layers using the ICP-CVD device 100.

Experimental Example 7

Figure 18:
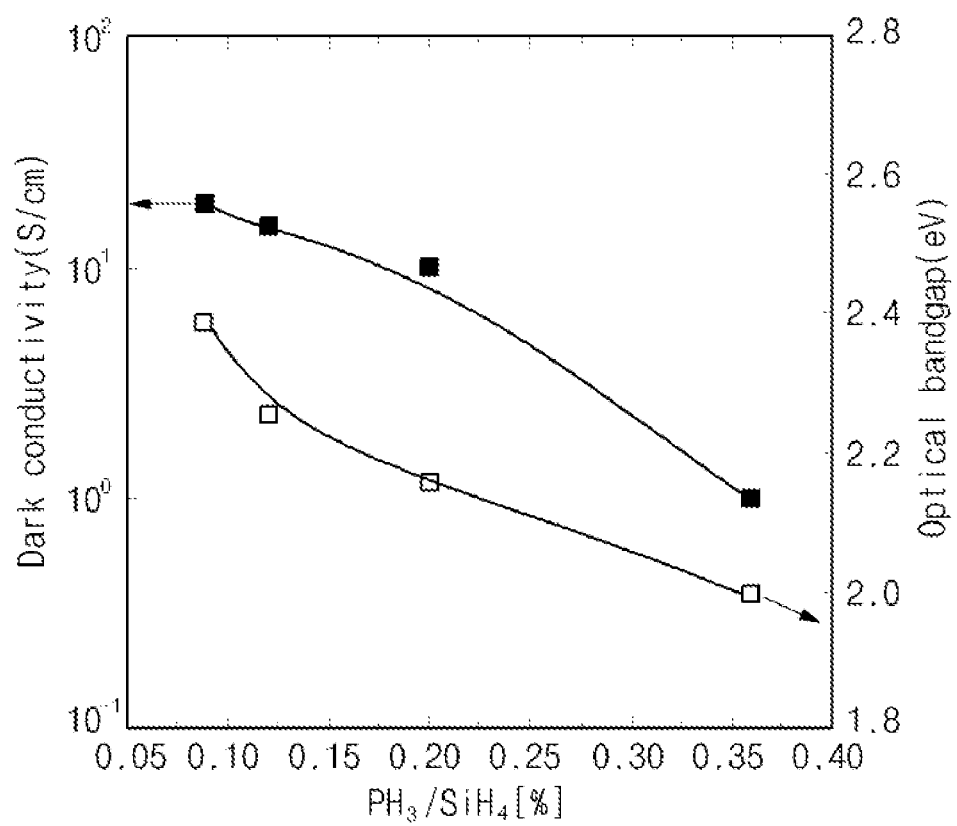
FIG. 18 is a graph illustrating changes in optical bandgap and dark conductivity depending on the phosphine gas ratio.
Figure 19:
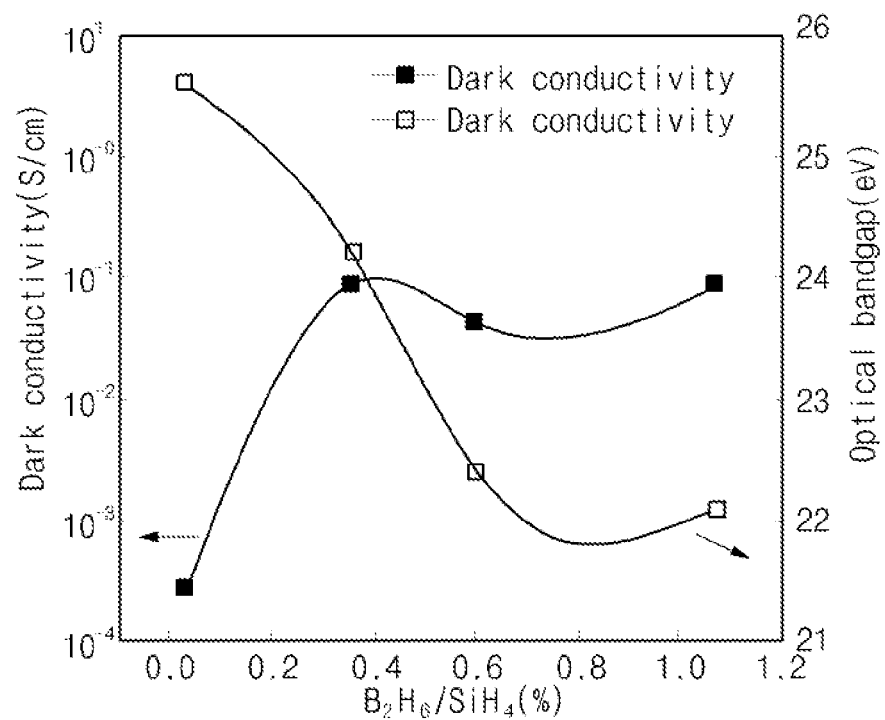
FIG. 19 is a graph illustrating changes in optical bandgap and dark conductivity depending on the diborane gas ratio.

FIG. 18 is a graph illustrating changes in optical bandgap and dark conductivity depending on the phosphine gas ratio, and FIG. 19 is a graph illustrating changes in optical bandgap and dark conductivity depending on the diborane gas ratio.

Referring to FIGS. 18 and 19, in order to microcrystallize the second-type layer 330 and the first-type layer 360, under the same processing conditions as those of Experimental Example 6, with varying the ratio of phosphine gas to silane gas and the ratio of diborane gas to silane gas, in mixed gas, the optimal ratios of each of phosphine gas and the diborane gas were selected.

In the second-type layer 330, mixed gas including phosphine ($P_2H_3$) gas being in a ratio of 0.075 to 0.1% relative to silane gas is preferably used as the mixed gas.

In the first-type layer 360, mixed gas including phosphine ($P_2H_3$) gas being in a ratio of 0.1 to 0.5% of diborane gas relative to silane gas is preferably used as the mixed gas.

As shown in FIGS. 18 and 19, when the phosphine gas ratio increases, the bandgap and the dark conductivity are both reduced. As the diborane gas ratio increases, the bandgap is reduced and the dark conductivity increases.

Referring back to FIG. 14, the method for fabricating the solar cell 300 will further be described. After S550, the second-type layer is formed in S560.

S560 is substantially the same as S440, except that only the impurity of S440 is changed into the first-type layer 240 is formed on the intrinsic layer 230. The first-type hydrogenated amorphous Si layer is formed as the first-type hydrogenated microcrystallized Si layer in substantially the same manner as in Experimental Example 7, and a detailed explanation will not be given.

In S570, a TCO (Transparent Conducting Oxide) such as ZnO (Zinc Oxide), AZO (Aluminum Zinc Oxide), ITO (Indium Tin Oxide), $SnO_2$:F, and so on, is deposited on the first-type layer 360 using a PVD device or a CVD device, in substantially same manner as described above, and a detailed explanation will not be given.

In S580, a conductive material, such as Al, is formed on the transparent electrode layer 370 on the second electrode. This step may be performed using a common technique for forming a conductive electrode, and a detailed explanation will not be given.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method for fabricating a solar cell comprising a first electrode, a first-type layer, an intrinsic layer, a second-type layer and a second electrode, the method comprising:
    preparing a first-type Si substrate;
    forming a first electrode on a rear surface of the first-type Si substrate;
    forming an intrinsic layer on a front surface of the first-type Si substrate;
    forming a second-type layer on the intrinsic layer; and
    forming a second electrode on the second-type layer,
    wherein at least one of the second-type layer, the intrinsic layer and the first-type layer is formed as a crystallized Si layer by an inductively coupled plasma chemical vapor deposition (ICP-CVD) device using mixed gas including hydrogen ($H_2$) gas and silane ($SiH_4$) gas, the mixed gas having a silane gas ($SiH_4$) in a ratio of 0.016 to 0.02.

2. The method of claim 1, wherein the ICP-CVD device uses an ICP power ranging from about 1150 to about 1250 W.

3. The method of claim 1, wherein in the forming of the first-type layer as the crystallized Si layer, a mixed gas including phosphine ($P_2H_3$) gas is used, wherein phosphine ($P_2H_3$) gas is in a ratio of 0.075 to 0.1% relative to silane gas in the mixed gas.

4. The method of claim 1, wherein in the forming of the second-type layer as the crystallized Si layer, a mixed gas including diborane is used, wherein the mixed gas includes 0.1 to 0.5% of diborane gas relative to silane gas.

5. The method of claim 1, wherein the first electrode includes Ag, the second layer includes a hydrogenated second-type amorphous Si layer, and the second electrode includes a transparent electrode layer formed on the second-type layer, and a patterned aluminum (Al) electrode formed on the transparent electrode layer.

6. The method of claim 5, wherein the transparent electrode layer comprises a transparent conducting oxide (TCO).

7. The method of claim 5, wherein the transparent electrode layer has a thickness in the range of about 100 to about 200 μm.

8. The method of claim 5, wherein the patterned aluminum (Al) electrode has a thickness in the range of about 0.2 to about 10 μm.

9. The method of claim 1, wherein the first electrode has a thickness in the range of about 0.3 to about 0.8 μm.

10. The method of claim 1, wherein the first-type Si substrate comprises a single crystal substrate doped with a first-type impurity.

11. The method of claim 1, wherein the first-type Si substrate has a thickness in the range of about 300 to about 1000 μm.

12. The method of claim 1, wherein the intrinsic layer comprises one of an I a-Si:H layer having a thickness in a range of about 3 to about 5 nm, or an I μc-Si:H layer having a thickness in a range of about 0.5 to about 2 μm.

13. The method of claim 1, wherein the second-type layer comprises one of a second-type a-SiC:H layer having a thickness in a range of about 10 to about 20 nm, or a P a-Si:H layer having a thickness in a range of about 11 to about 12 nm.

* * * * *